United States Patent [19]

Zimatore et al.

[11] 3,800,232

[45] Mar. 26, 1974

[54] AUTOMATIC TUNING DEVICES

[76] Inventors: Carmelo Zimatore, Via Del Nuoto, 10-Rome; Sergio Troiani, Via Cassia, 929-Rome, both of Italy

[22] Filed: Mar. 22, 1972

[21] Appl. No.: 236,912

[30] Foreign Application Priority Data

Mar. 31, 1971 Italy .................................. 49426/71

[52] U.S. Cl. ..................... 325/470, 325/423, 334/16

[51] Int. Cl. .............................................. H04b 1/34

[58] Field of Search.... 325/422, 423, 457, 468–471; 334/14–16, 18, 26

[56] References Cited

UNITED STATES PATENTS

| | | | |
|---|---|---|---|
| 3,560,858 | 2/1971 | Sakai et al. .......................... | 325/470 |
| 3,588,706 | 6/1971 | Sakai et al. .......................... | 325/423 |
| 3,611,152 | 10/1971 | Sakai et al. .......................... | 325/422 |

*Primary Examiner*—Albert J. Mayer
*Attorney, Agent, or Firm*—Browdy and Neimark

[57] ABSTRACT

A capacitor memory in an automatic and manual control of a tuner eliminates local oscillator drifts.

6 Claims, 3 Drawing Figures

AUTOMATIC TUNING DEVICES

The information reaches the memory unit through circuits which are sensitive to the signal which normally comes from a discriminator, which circuits generally supply a voltage or a current which is variable during the search of the transmitter and interrupt their action when a signal is picked up. There are also provided means which may be actuated manually to perform a manual search for a transmitter, or to start the automatic search for a new transmitter.

Furthermore, during the automatic search, when the end of the scale is reached, a return circuit cancels the information from the memory unit, thus permitting to re-start the search from the other end of the scale. Such known tuner control and others of this type are subject to considerable difficulties with regard to their calibration, to the variations of the tuning frequencies under the variation of the voltage supply of the ambient temperature etc.

The above mentioned difficulties of the known art are obviated by the present invention, which supplies a device comprising: a control circuit for fine tuning, having a signal input, a control input and an output, the signal input being connected with the output of a discriminator, eventually through an amplifier; a control unit for manual tuning, whose output is connected with the input of said fine tuning control circuit; a discharge circuit for the memory unit; a first input which is connected with the output of said fine tuning control circuit, a second input which is connected with the output of the already mentioned return circuit and whose output is connected with the memory unit; a charging circuit for the memory unit, a first input of which is connected with the output of the circuit which supplies the signal which is to be memorized, a second input of which is connected with the output of the fine tuning control circuit and whose output is connected with the memory unit.

The present invention will clearly result from the following detailed description of one of its embodiments, it being understood that this embodiment is here described and illustrated for a purely exemplificative and in no way limitative purpose.

Figure 1:
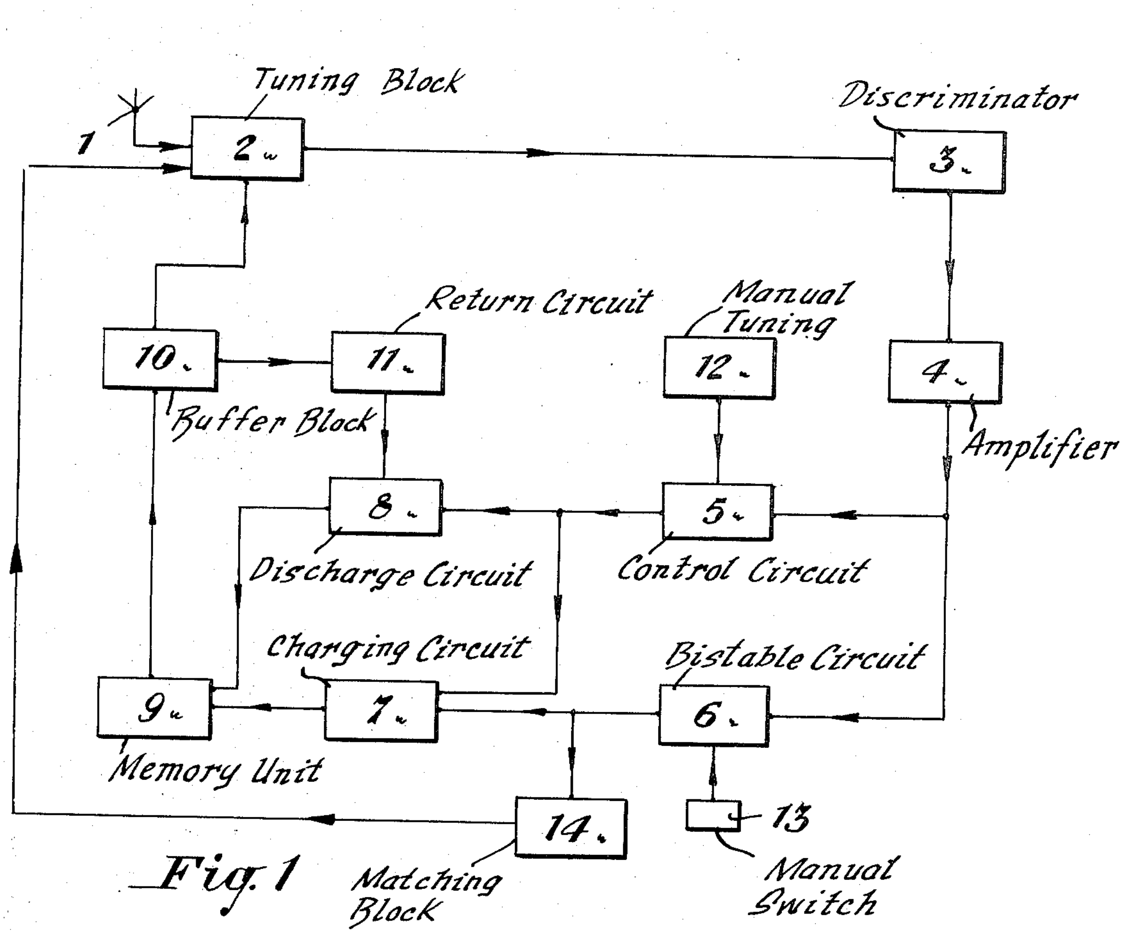
FIG. 1 is a block diagram of a device according to the invention.

In FIG. 1, the reference numeral 1 indicates an antenna, connected with the input of a tuning block 2, of the type having circuits whose resonance frequency may be varied by purely electrical means, such as those initially mentioned. The output of block 2 is connected, if necessary by the usual intermediate frequency (I.F.) circuits (not shown) in a receiver with the input of a discriminator block 3, whose output is applied to an amplifier block 4. The output of block 4 is connected on one hand with the input of a control circuit block 5 and, on the other hand, with the input of a bistable circuit block 6. The output of block 6 is connected with the input of a charge circuit block 7, while the output of block 5 is connected to an additional input of block 7 and with the input of a discharge circuit block 8. Both blocks 7 and 8 act, in a manner which will be described in the following, upon a memory unit 9, which in turn acts upon the tuner block 2 through a buffer block 10. A second output of buffer 10 is also applied, through a return circuit block 11 for the automatic signal search, to a block 8 for the discharge of the memory unit correspondingly to one of the scale ends. Block 11 is a monostable circuit of any suitable known type, which switches from an off condition to an on condition when its input reaches a given threshold value, and remains in this on condition for a preestablished duration. While in this on condition, it cancels the information stored in the memory unit 9, thereby permitting to restart the scanning operation.

Block 5 has also the function of suppressing the disturbances from block 4 so as to prevent them from affecting blocks 7 and 8. Block 5 is also connected with a block 12 for manual tuning, while block 6 is connected with a block 13 for the automatic tuning control.

Block 6 is also connected with a matching block 14. The output of the matching block 14 is connected to tuner block 2 or to the I.F. circuit (not shown) and the low frequency or the (L.F.) circuit (not shown) which is located between the discriminator and the loudspeaker of the receiver (if such I.F. and L.F. circuits exist in the receiver). The connection of 14 to tuner 2 or the I.F. circuit serves the function of desensitizing block 2 or the I.F. circuit (not shown) and silencing the L.F. circuit (not shown) during the automatic search of a transmitter. Desensitization is the forced reduction to minimum sensitivity of an automatic control device. More particularly, "desensitizing" is the action which is determined by block 14 to "reduce the sensitivity" of the receiver. This is done during the scanning phase for the purpose of tuning the stations which may be received at an acceptable signal-to-noise ratio. The connection of the matching circuit 14 to the L.F. circuit (not shown) serves for silencing or muting to avoid hearing the low frequency in the loudspeaker during the scanning phase. Circuits such as those performing the function of block 14 are commonly known as "squelch circuits" and are per se known.

The operation of the device is the following:

When it is switched in, the bistable block 6 is in the scanning position. The charging circuit 7 conducts and charges the memory unit 9 and determines, through the buffer block 10, a variation of the resonant frequency of the receiver, for instance by means of a variation of the bias voltage of the variable capacity tuning units.

When the resonant frequency of the circuits approaches a signal, the output voltage of the discriminator block 3 (see FIG. 3) shifts in the direction necessary to bring about, through the amplifier block 4, a change of state of the bistable block 6. With this change of state, the charging circuit 7 stops conducting and thus also the scanning function is interrupted.

Figure 3:
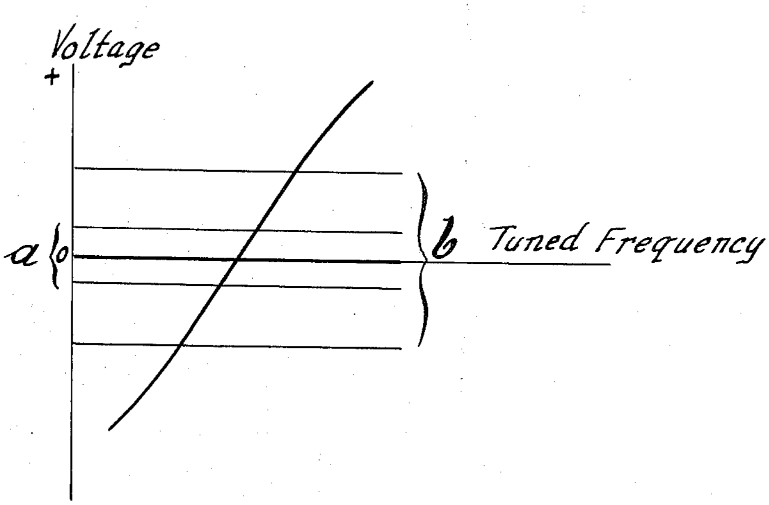
FIG. 3 is a diagram of the output voltage of the discriminator as a function of the input frequency.

Tuning is completed by using again the information present at the output of the amplifier block 4, which information permits the control circuit 5 to actuate again the charging circuit 7 (see FIG. 3).

As soon as the correct tuning is attained, the output of discriminator block 3 presents a preestablished voltage value which is in the neighborhood of zero and which, through block 4 and the control circuit 5, blocks the charging circuit 7.

The maintenance of tuning is conditioned to the presence of the required voltage in the memory unit 9.

The improvement attained by the invention permits the device for the automatic or manual control of the tuner to eliminate the drawbacks deriving from the effects of losses in the capacitor and possible drifts of the local oscillator, which cause a variation in the output voltage of the discriminator in the two possible senses.

In fact, these voltage variations at the output of the discriminator and therefore at the output of the amplifier block 4 affect the control circuit 5 and cause, according to their magnitude and sign, the conduction of the charging circuit 7 or of the discharge circuit 8.

The voltage of the memory unit 9 is consequently changed, tuning is corrected and the output of the discriminator shifts to the value necessary for the compensation of all the above mentioned inconveniences. The zone of inoperativeness *a* of the control circuit (see FIG. 3) causes the above mentioned correction of tuning to actually occur only in the case of a drift (whatever its causes) of the local oscillator.

The zone of inoperativeness *b* of the bistable circuit 6 and the zone of inoperativeness *a* of the control circuit 5 have the effect that the absence of a signal fails to start the scanning function or the variation of the resonant frequency.

Figure 2:
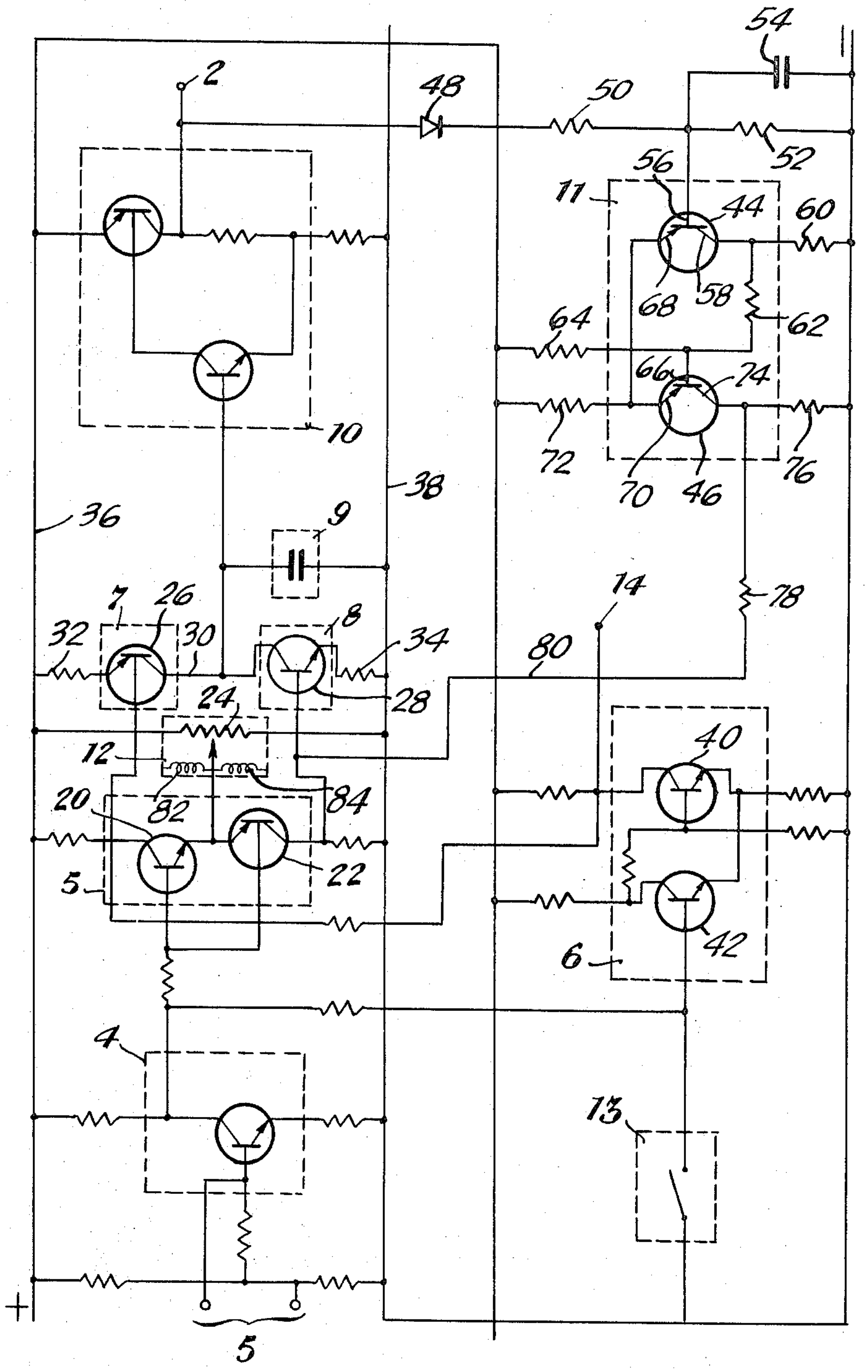
FIG. 2 shows a circuit according to the block diagram of FIG. 1.

An example of a circuit built conformingly to the block diagram of FIG. 1 is shown in FIG. 2, wherein the individual blocks are indicated with the same reference numerals as in FIG. 1.

Block 5 comprises an npn transistor 20 and a pnp transistor 22, whose emitters are connected together and whose bases are also connected together. A signal coming from the amplifier block 4 reaches the bases of transistors 20 and 22, while the emitters of the transistors 10 and 22 are connected to a potentiometer 24, which forms the manual tuning block 12. Potentiometer 24 is spring biased by springs 82,84 which coact in opposite directions towards a rest position midway between its two ends with its slider in the central position, wherefore the manual tuning will be performed by displacing manually the slider of the potentiometer away from its rest position, to which it will revert through the coaction of springs 82,84 once it is left loose.

According to the direction in which said slider is shifted, there will be a shift of the tuned circuits of the tuner towards higher or lower frequencies, while the distance of the slider from its rest position will determine the speed at which the scanning occurs.

The collectors of transistors 20 and 22 are respectively connected to the bases of the transistors 26 and 28, whose collectors are connected together and to the memory unit 9 by a wire 30.

Their emitters are connected through resistors 32 and 34 to the positive supply line 36 and the negative supply line 38 respectively.

Block 6 is a bistable circuit, of a type similar to the bistable circuit shown as block 2 in FIGS. 1 and 3 of the previously noted U.S. Pat. No. 3,467,871, which comprises transistors 40 and 42. It is triggered manually into the scanning state by closing the normally open switch 13. In this condition it charges the capacitor 9 until a transmitter is found.

The circuit according to the invention warrants that also in the case of a manual search of a transmitter, the fine tuning to its signal is automatically achieved by means of the charging circuit block 7 and the discharge circuit block 8 and therefore it is sufficient that the slider of the potentiometer 24 is released when the tuning circuit has been tuned to a frequency which is sufficiently near to that of the transmitter, to have said transmitter automatically tuned to precision owing to the action of the circuits which charge and discharge the capacitor which forms the memory unit 9, in a manner identical to the fine tuning achieved during the automatic scanning.

It must be noted that the use of the charging and discharge circuits provides not only fine tuning to a transmitter, but also an automatic compensation of the troubles deriving from the fact that the individual electric components are not ideal and there exists inaccuracies of calibration.

Block 11 comprises transistors 44 and 46 of the pnp type. The output of the buffer block 10 controls; through diode 48, resistors 50,52 which act as voltage dividers, and the capacitor 54; the current of base 56 of transistor 44. The collector 58 of transistor 44 controls, through the resistors 60, 62, 64 which also act as voltage dividers, the current of base 66 of transistor 46. The emitters 68 of transistor 44 and 70 of 46 are connected with one another and with the positive feed voltage through bias resistor 72. The collector 74 of transistor 46 controls, through resistors 76, 78 which act as voltage dividers, the transistor 28 via line 80.

The whole assembly is a monostable circuit and operates thus: in the stable state transistor 44 is in the off condition and transistor 46 is in the on condition and no signal passes through line 80. When the output voltage of block 10 is sufficiently low, i.e. when the tuning circuit has reached either scale end, transistor 44 switches into the on condition, and thus switches transistor 46 into the off condition, transistor 28 of block 8 becomes conducting and charges the memory unit 9. Consequently the output voltage of block 10 rises so that the tuning circuit reaches the other scale end. The increased output voltage of block 10 restores transistor 44 to the off condition, after a time delay determined by the time constant of the network formed essentially by the resistors 50,52 and the capacitor 54. Thus block 11 reverts to its stable state till the successive reaching of the first indicated scale end. In this regard, it should be noted that blocks 4, 5 and 1 in FIGS. 1 and 3 of previously cited U.S. Pat. No. 3,467,871 perform the same return circuit function as blocks 11, 10 and 9, respectively, of this application.

It is obvious that many and different variants may be applied by the experts in the art to the above illustrated form of embodiment of the invention, without departing from its idea; it is understood that those variants are all encompassed in the scope of the present invention.

We claim:

1. A device for the automatic and manual control of a tuner for electromagnetic wave receivers, wherein the electronic tuning means are controlled, by means of a memory unit and a bistable circuit, by the output of a discriminator block during the automatic search, so as to block said search in the vicinity of a signal emitted by a transmitting station, while a return circuit enables the tuner to restart the scanning from one end of a band when it has reached the other end of said band, said device comprising: a control circuit for fine tuning, having a signal input, a control input and an output, the signal input being connected with the output of said discriminator via an amplifier, a manual tuning circuit, whose output is connected with the control input of said control circuit; a discharge circuit for the memory unit, having a first input connected with the output of the control circuit, a second input connected with the output of said return circuit and an output connected with the memory unit; a buffer circuit having an input connected with the memory unit, a first output connected with the tuner and a second output; a charging circuit to charge the memory unit, said charging circuit having a first input connected with the output of the circuit which supplies the signal to be stored, a second input connected with the output of the control circuit and an output connected with a memory unit, said return circuit having its input connected with said second output of said buffer circuit and its output connected with said second input of said discharge circuit, said bistable circuit having a first input connected with said amplifier, a second input controlled by a manual switch, and its output connected with said first input of said charging circuit, the arrangement being such that the automatic search is excluded, in the vicinity of the resonance frequency with the signal, upon the change of state of said bistable circuit and the charging circuit is actuated by the control circuit until fine tuning is achieved.

2. A device according to claim 1, wherein the control circuit comprises an npn transistor and a pnp transistor, while their collectors are connected via two resistors, to the positive and negative supply lines, their two bases being additionally connected with the discriminator output, the two emitters being additionally connected with the output of the manual tuning control.

3. A device according to claim 2, wherein the manual tuning circuit comprises a potentiometer whose slider is spring biased towards a central position corresponding to the rest position of said potentiometer, the terminals of said potentiometer being connected with the positive and negative feed lines respectively, while the slider is connected with the emitters of the transistors of the control circuit.

4. A device according to claim 3, wherein the discharge circuit for the memory unit comprises a npn transistor, whose emitter is connected through a resistor to a feed line, whose base is connected with the collector of the pnp transistor of the control circuit and with the output of the return circuit, and whose collector is connected with the memory unit and with the output of the charging circuit.

5. A device according to claim 4, wherein the charge circuit of the memory circuit consists of a pnp transistor, whose emitter is connected through a resistor to one of the feed lines, whose base is connected with the collector of the npn transistor of the control circuit and whose collector is connected with the memory unit and the collector of the transistor of the discharge circuit of the memory unit.

6. A device according to claim 1, comprising additionally a matching circuit, which is sensitive to the output signal of the bistable circuit and capable of effecting a desensitization and a silencing of the receiver comprising said device.

* * * * *

UNITED STATES PATENT OFFICE

CERTIFICATE OF CORRECTION

Patent No. 3,800,232 Dated March 26, 1974

Inventor(s) Carmelo ZIMATORE et al.

It is certified that error appears in the above-identified patent and that said Letters Patent are hereby corrected as shown below:

circuit to vary the frequency tuned during the automatic search of a transmitter, as well as for maintaining the synchronization.--.

Column 3, line 35, delete "10" and insert therefore --20--.

Signed and sealed this 30th day of July 1974.

(SEAL)
Attest:

McCOY M. GIBSON, JR.
Attesting Officer

C. MARSHALL DANN
Commissioner of Patents